(12) United States Patent
Chen et al.

(10) Patent No.: US 11,387,150 B2
(45) Date of Patent: Jul. 12, 2022

(54) FABRICATING METHOD OF DECREASING HEIGHT DIFFERENCE OF STI

(71) Applicant: United Semiconductor (Xiamen) Co., Ltd., Fujian (CN)

(72) Inventors: Hui Min Chen, Shamen (CN); Song Gu, Singapore (SG); Kai Ping Huang, Singapore (SG); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 0 days.

(21) Appl. No.: 17/129,848

(22) Filed: Dec. 21, 2020

(65) Prior Publication Data

US 2022/0139785 A1 May 5, 2022

(30) Foreign Application Priority Data

Nov. 3, 2020 (CN) .......................... 202011208973.6

(51) Int. Cl.
*H01L 21/8238* (2006.01)
*H01L 21/266* (2006.01)
*H01L 21/762* (2006.01)

(52) U.S. Cl.
CPC .... *H01L 21/823878* (2013.01); *H01L 21/266* (2013.01); *H01L 21/76224* (2013.01)

(58) Field of Classification Search
CPC ........... H01L 21/823878; H01L 21/266; H01L 21/76224
See application file for complete search history.

(56) References Cited

U.S. PATENT DOCUMENTS

| | | | |
|---|---|---|---|
| 2008/0020534 A1 | 1/2008 | Culmsee | |
| 2017/0263328 A1* | 9/2017 | Maekawa | ........... H01L 27/1203 |
| 2018/0190537 A1* | 7/2018 | Li | ....................... H01L 21/3065 |

FOREIGN PATENT DOCUMENTS

| | | | |
|---|---|---|---|
| CN | 102013411 A | 4/2011 | |
| CN | 103337507 A | 10/2013 | |
| CN | 103903969 A | 7/2014 | |
| CN | 104201146 A | 12/2014 | |
| CN | 107845636 A | 3/2018 | |

* cited by examiner

*Primary Examiner* — Karen Kusumakar
*Assistant Examiner* — Adam S Bowen
(74) *Attorney, Agent, or Firm* — Winston Hsu (57) ABSTRACT

A method of decreasing height differences of STIs includes providing a substrate comprising a peripheral circuit region. The peripheral circuit region includes a P-type transistor region and an N-type transistor region. A first STI and a third STI are respectively disposed within the N-type transistor region and the P-type transistor region. Later, a first mask is formed to cover the N-type transistor region. Then, an N-type well is formed in the P-type transistor region and part of the third STI is removed by taking the first mask as a mask. Next, the first mask is removed. After that, a second mask is formed to cover the P-type transistor region. Subsequently, a P-type well is formed in the N-type transistor region and part of the first STI is removed by taking the second mask as a mask. Finally, the second mask is removed.

8 Claims, 11 Drawing Sheets

FIG. 11

FABRICATING METHOD OF DECREASING HEIGHT DIFFERENCE OF STI

BACKGROUND OF THE INVENTION

1. Field of the Invention

The present invention relates to a method of decreasing height differences of shallow trench isolations (STIs), and more particularly relates to a method of decreasing height differences of STIs within a core circuit region and a peripheral circuit region.

2. Description of the Prior Art

Semiconductor device fabrication involves using a number of fabrication processes to build a desired device. Generally, a semiconductor device is fabricated on a semiconductor material referred to as a substrate by forming layers or components, selectively patterning formed layers, and selectively implanting dopants into layers and/or the substrate in order to achieve desired operational characteristics.

Semiconductor devices that are created on the surface of a substrate are electrically isolated from each other using techniques that are well established and that have been used extensively in the art. Currently, both localized oxidation of silicon (LOCOS) and shallow trench isolation (STI) regions are used to electrically isolate multiple active devices so that they do not interfere with each other's operations. However, the disadvantages of LOCOS includes that the bird's beak structure encroaches into the device active area. Therefore, an alternate approach to defining active regions in the surface of a substrate is the use of STIs.

However, there are height differences between the top surfaces of STIs and the substrate. Moreover, the height differences are also occurred between STIs located within different regions. These height differences lead to fabrication deviations.

SUMMARY OF THE INVENTION

This in mind, the present invention provides a method of decreasing height differences of STIs to prevent the fabrication deviations.

According to a preferred embodiment of the present invention, a method of decreasing height differences of STIs includes providing a substrate comprising a core circuit region and a peripheral circuit region, wherein the peripheral circuit region includes a P-type transistor region and an N-type transistor region, and wherein a pad oxide covers the substrate. Next, a first STI, a second STI and a third STI are formed to respectively dispose within the N-type transistor region of the peripheral circuit region, the core circuit region and the P-type transistor region of the peripheral circuit region, wherein the first STI, the second STI and the third STI are embedded within the pad oxide and the substrate, a top surface of the first STI protrudes a height from a top surface of the substrate, a top surface of the second STI protrudes the height from the top surface of the substrate, a top surface of the third STI protrudes the height from the top surface of the substrate. After that, a first mask is formed to cover the core circuit region and the N-type transistor region and to expose the third STI and the P-type transistor region of the peripheral circuit region. Then, an N-type well is formed by doping N-type dopants into the P-type transistor region which is exposed through the first mask and part of the third STI which is exposed through the first mask is removed to make the top surface of the third STI protrude a first distance from the top surface of the substrate. The first distance is smaller than the height. Subsequently, the first mask is removed. Later, a second mask is formed to cover the core circuit region and the P-type transistor region and to expose the first STI and the N-type transistor region of the peripheral circuit region. After that, a P-type well is formed by doping P-type dopants into the N-type transistor region which is exposed through the second mask and part of the first STI which is exposed through the second mask is removed to make the top surface of the first STI protrude a second distance from the top surface of the substrate. The second distance is smaller than the height. Next, the second mask is removed. After forming the P-type well and the N-type well, a first silicon oxide layer is formed to replace the pad oxide. After forming the first silicon oxide layer, a third mask is formed to cover the peripheral circuit region and to expose the second STI and the first silicon oxide layer within the core circuit region. Later, part of the second STI and an entirety of the first silicon oxide layer within the core circuit region are removed by taking the third mask as a mask so that a top surface of the part of the second STI protrudes a third distance from the top surface of the substrate. The third distance is smaller than the height. Finally, the third mask is removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 depict a method of decreasing height differences of shallow trench isolations (STIs) according to a preferred embodiment of the present invention, wherein.

DETAILED DESCRIPTION

Figure 1:
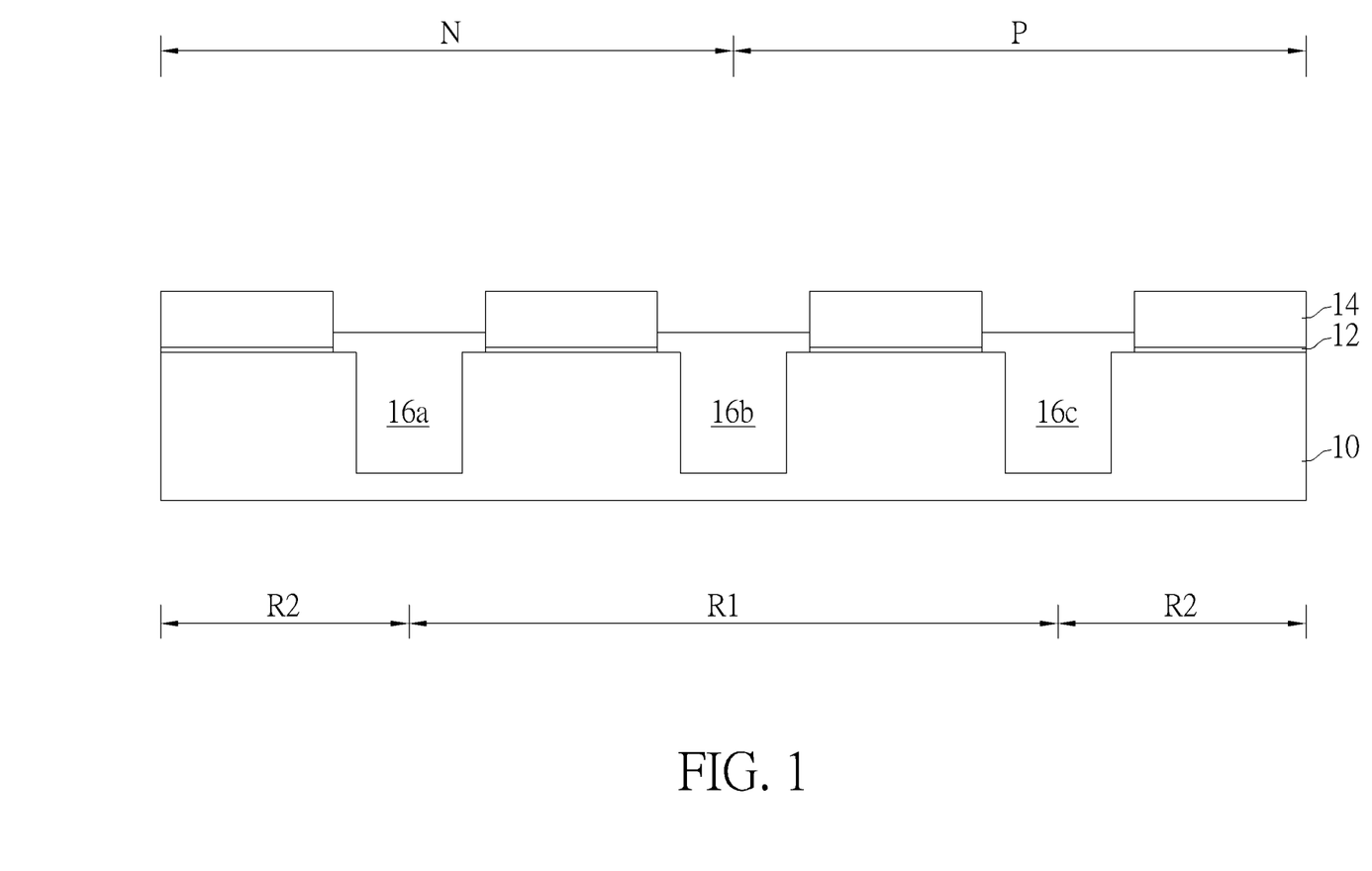
FIG. 1 depicts a substrate with STIs.

FIG. 1 to FIG. 10 depict a method of decreasing height differences of shallow trench isolations (STIs) according to a preferred embodiment of the present invention. As shown in FIG. 1, a substrate 10 is provided. The substrate 10 a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The substrate 10 includes a core circuit region R1 and a peripheral circuit region R2. The peripheral circuit region R2 includes a P-type transistor region P and an N-type transistor region N. The core circuit region R1 also includes the P-type transistor region P and the N-type transistor region N. Later, a pad oxide 12 and a pad nitride 14 are formed in sequence to cover the substrate 10. Then, the pad oxide 12 and the pad nitride 14 are patterned to form numerous pre-determined positions for STIs. After that, the substrate 10 is etched to form numerous trenches within the substrate 10 by taking the pad oxide 12 and the pad nitride 14 as a mask. Next, a silicon oxide layer fills into the trenches to serve as STIs. More specifically speaking, the STIs may include a first STI 16a, a second STI 16b and a third STI 16c embedded into the pad nitride 14, the pad oxide 12 and the substrate 10. Part of the first STI 16a is disposed within the peripheral circuit region R2, and part of the first STI 16a is disposed within the core circuit region R1. Moreover, the first STI 16a is entirely within the N-type transistor region N. The second STI 16b is entirely within the core circuit region R1. Furthermore, part of the second STI 16b is disposed within the N-type transistor region N, and part of the second STI 16b is disposed within the P-type transistor region P. Part of the third STI 16c is disposed within the peripheral circuit region R2, part of the third STI 16c is disposed within the core circuit region R1 and the third STI 16c is entirely disposed within the P-type transistor region P.

However, according to different product designs, it is not necessary that the STI must be partly within the peripheral circuit region R2 and partly within the core circuit region R1. The STI can also be entirely within the peripheral circuit region R2 or the core circuit region R1. The location of the STI can be altered based on different requirements, as long as there are STIs respectively disposed within the P-type transistor region P of the peripheral circuit region R2, N-type transistor region N of the peripheral circuit region R2, and the core circuit region R1, the method of the present invention can be applied.

Later, the first STI 16a, the second STI 16b and the third STI 16c are etched back to make a top surface of the first STI 16a, a top surface of the second STI 16b and a top surface of the third STI 16c slightly lower than a top surface of the pad nitride 14 but higher than a top surface of the pad oxide 12.

Figure 2:
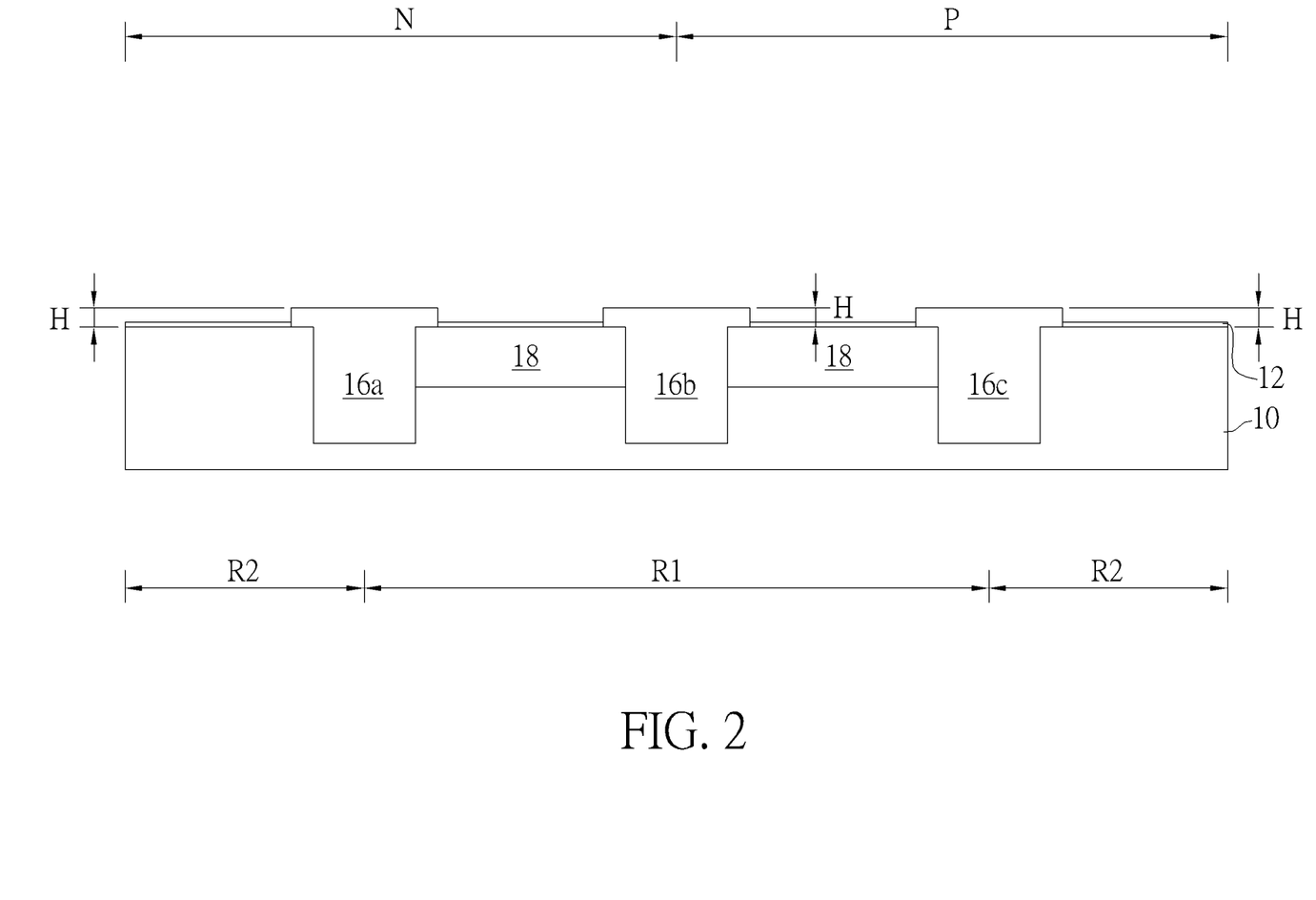
FIG. 2 is a fabricating stage following FIG. 1.

As shown in FIG. 2, the pad nitride 14 is removed and the pad oxide 12 is remained. Now, a top surface of the first STI 16a protrudes a height H from a top surface of the substrate 10, a top surface of the second STI 16b protrudes the height H from the top surface of the substrate 10, a top surface of the third STI 16c protrudes the height H from the top surface of the substrate 10. Subsequently, a doped well 18 is formed within the core circuit region R1 of the substrate 10. According to a preferred embodiment of the present invention, the height H is between 100 and 600 angstroms.

Figure 3:
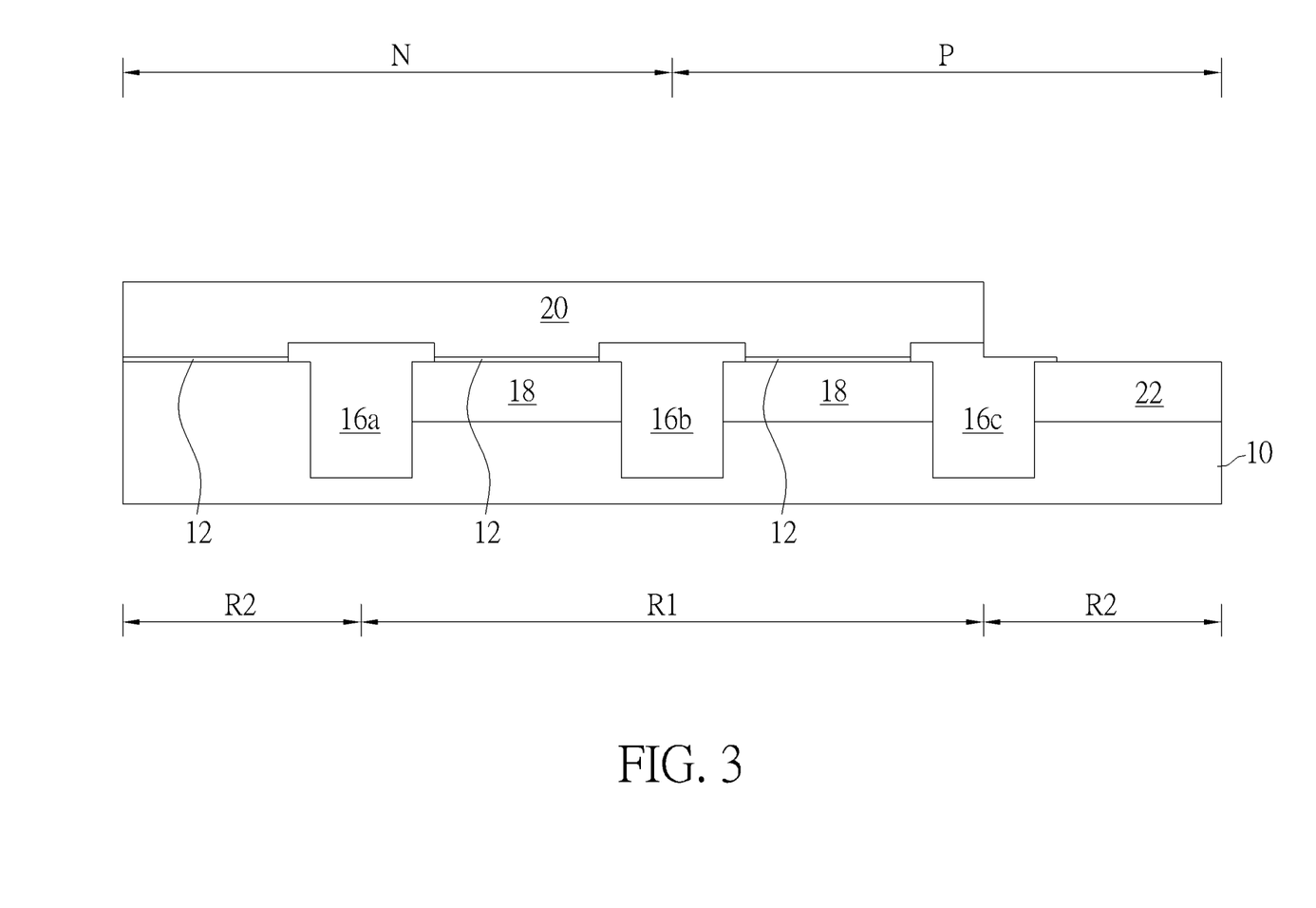
FIG. 3 is a fabricating stage following FIG. 2.

As shown in FIG. 3, a first mask 20 is formed to cover the entirety of the core circuit region R1 and the N-type transistor region N and expose at least part of the third STI 16c and part of the P-type transistor region P. More specifically speaking, the third STI 16c within the peripheral circuit region R2 and the P-type transistor region P within the peripheral circuit region R2 are exposed. Next, N-type dopants are implanted into the substrate 10 at the P-type transistor region P to form an N-type well 22 by taking the first mask 20 as a mask. After forming the N-type well 22, part of the third STI 16c is removed by taking the first mask 20 as a mask so that the top surface of the third STI 16c protrudes a first distance from the top surface of the substrate 10, and the first distance is smaller than the height H. Please refer to FIG. 2 for the height H. The third STI 16c is preferably removed by a dry etching. Because the density of the silicon oxide in the pad oxide 12 and the density of the silicon oxide of the third STI 16c are different, part of the third STI 16c can be removed while remaining the pad oxide 12. Now, the first distance of the third STI 16c within the peripheral circuit region R2 is between 50 and 500 angstroms. According to a preferred embodiment of the present invention, the top surface of the third STI 16c is aligned with the top surface of the pad oxide 12.

Figure 4:
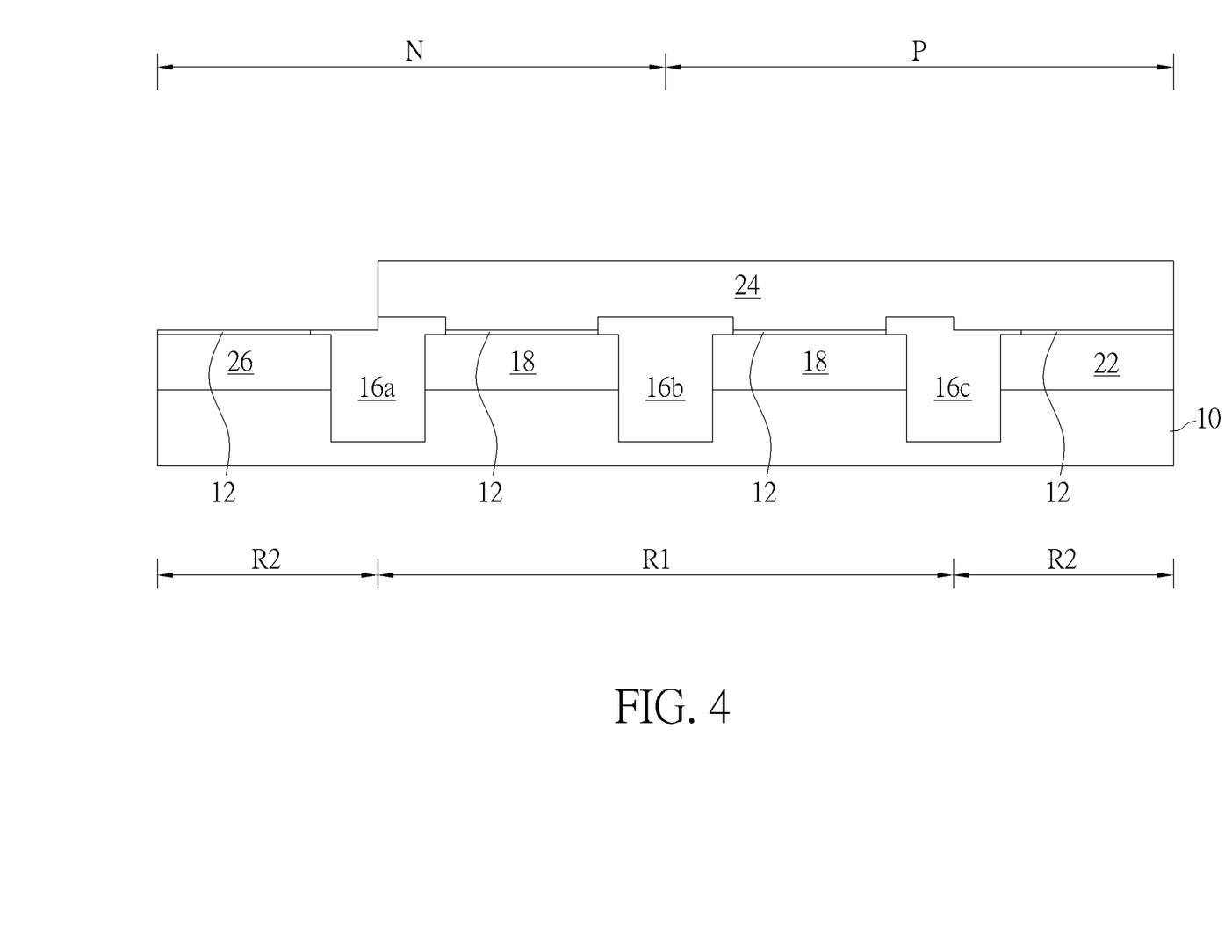
FIG. 4 is a fabricating stage following FIG. 3.

As shown in FIG. 4, the first mask 20 is removed. Then, a second mask 24 is formed to cover the entirety of the core circuit region R1 and an entirety of the P-type transistor region P and expose at least part of the first STI 16a and part of the N-type transistor region N. Next, P-type dopants are implanted into the substrate 10 at the N-type transistor region N to form a P-type well 26 by taking the second mask 24 as a mask. After forming the P-type well 26, part of the first STI 16a is removed by taking the second mask 24 as a mask so that the top surface of the first STI 16a protrudes a second distance from the top surface of the substrate 10, and the second distance is smaller than the height H. Please refer to FIG. 2 for the height H. The first STI 16a is preferably removed by a dry etching. Now, the second distance of the first STI 16a within the peripheral circuit region R2 is between 50 and 500 angstroms. According to a preferred embodiment of the present invention, the top surface of the first STI 16a is aligned with the top surface of the pad oxide 12.

It is noteworthy that the fabricating steps illustrated in FIG. 3 and FIG. 4 can be exchanged. That is, the steps in FIG. 4 including forming the P-type well 26 followed by removing the first STI 16a within the peripheral circuit region R2 can be performed first. The steps in FIG. 3 including forming the N-type well 22 followed by removing the third STI 16c within the peripheral circuit region R2 can be performed later.

The masks used for forming the P-type well or the N-type well are also served to remove part of each of the STIs within the peripheral circuit region R2 so that the height of each of the STIs within the peripheral circuit region R2 is decreased. In this way, in the subsequent steps, the height differences between substrate 10 and the STIs can be decreased. Because the second mask 24 is used for forming the P-type well 26 and for removing the first STI 16a, an extra mask is not needed for removing the first STI 16a. Similarity, because the first mask 20 is used for forming the N-type well 22 and for removing the third STI 16c, an extra mask is not needed for removing the third STI 16c. Therefore, the fabricating steps of the present invention reduce the manufacturing steps and decrease the numbers of masks.

Figure 5:
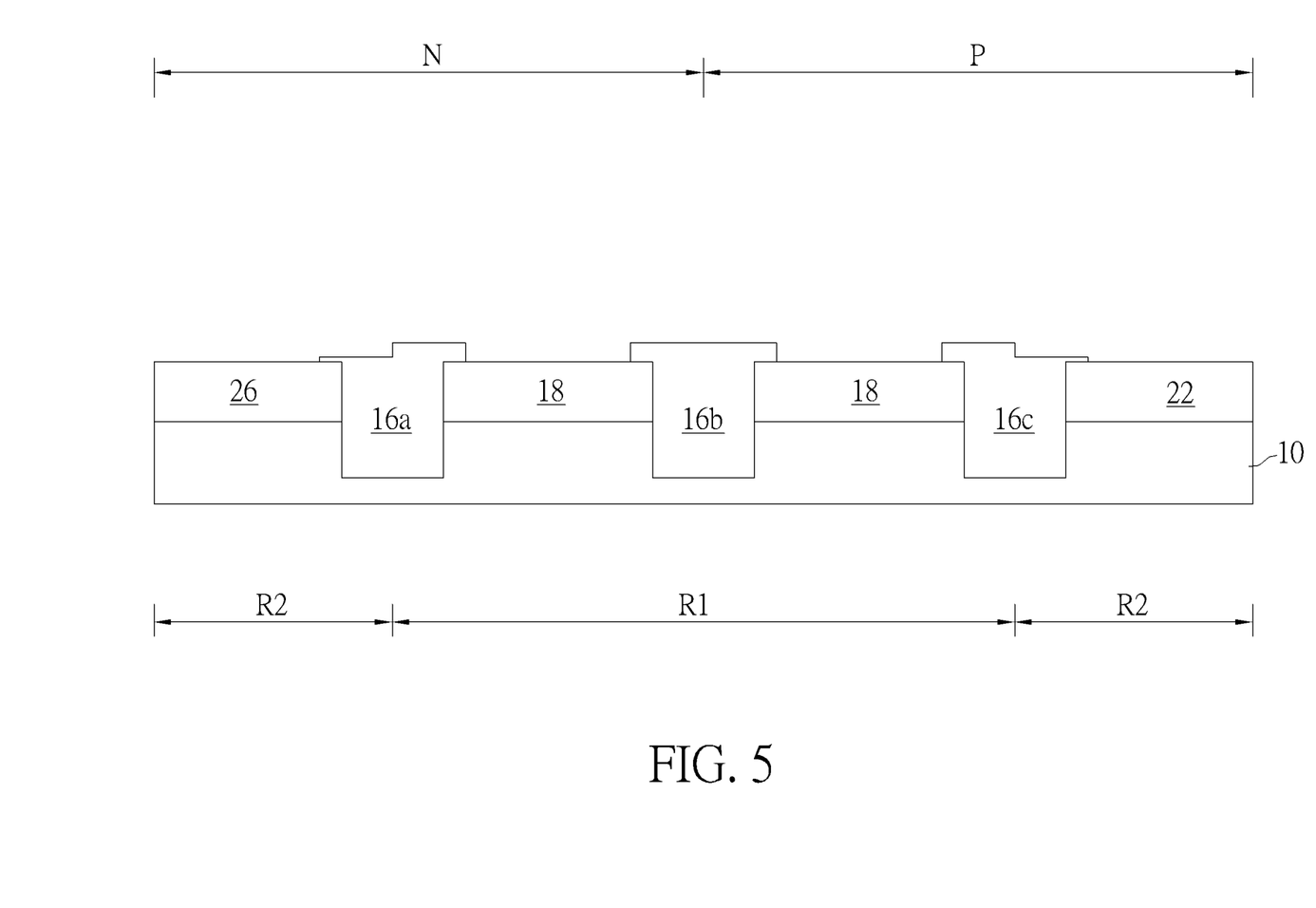
FIG. 5 is a fabricating stage following FIG. 4.
Figure 6:
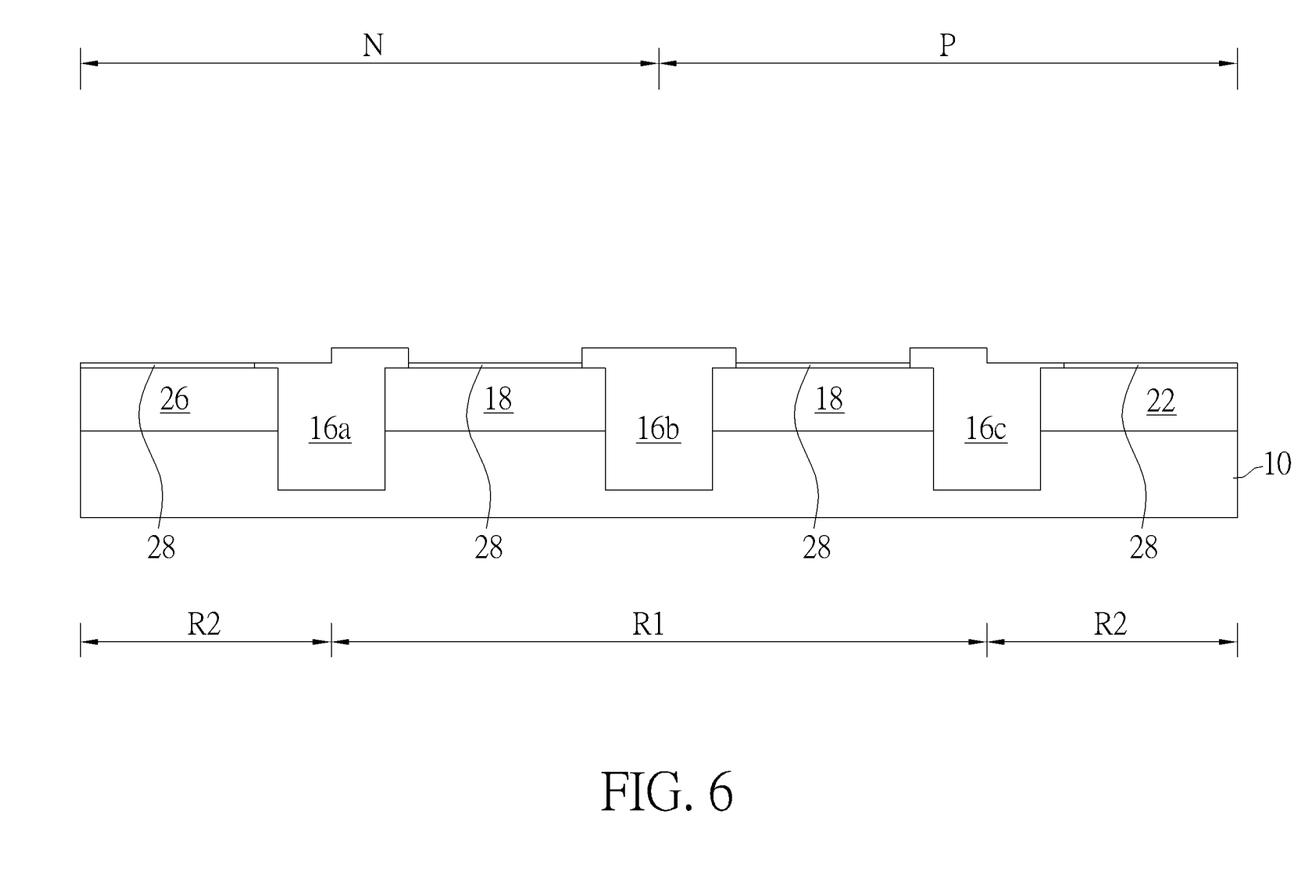
FIG. 6 is a fabricating stage following FIG. 5.

As shown in FIG. 5, the second mask 24 is removed followed by removing the pad oxide 12 entirely. The pad oxide 12 is preferably removed by a wet etching or other processes which can remove silicon oxide. As shown in FIG. 6, a first silicon oxide layer 28 is formed to replace the pad oxide 12. The thickness of the first silicon oxide layer 28 is preferably between 10 and 100 angstroms. According to a preferred embodiment, the top surface of the first STI 16a within the peripheral circuit region R2 is aligned with the top surface of the first silicon oxide layer 28. The top surface of the third STI 16c within the peripheral circuit region R2 is aligned with the top surface of the first silicon oxide layer 28. The first silicon oxide layer 28 is preferably formed by oxidizing the surface of the substrate 10.

Figure 7:
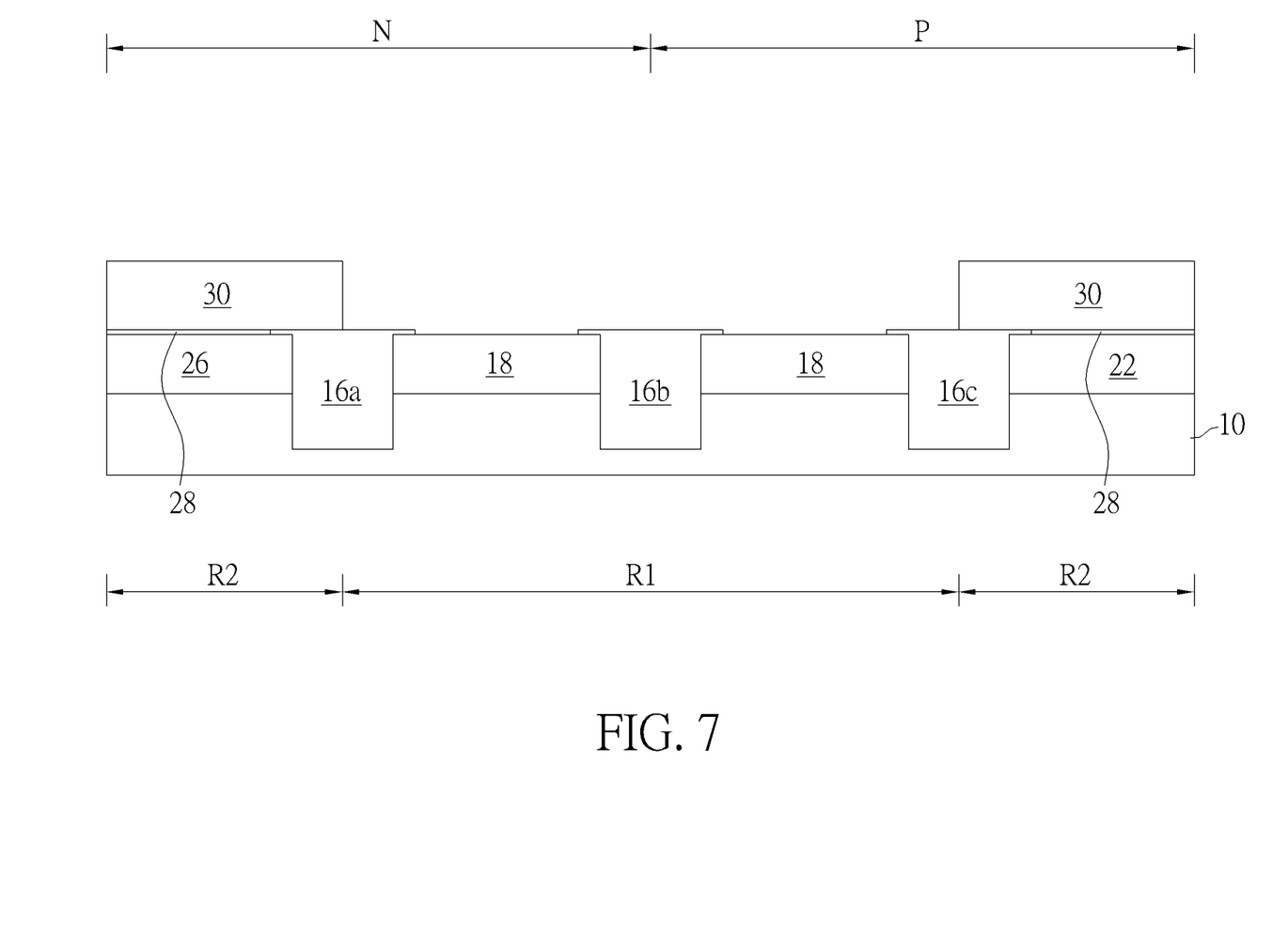
FIG. 7 is a fabricating stage following FIG. 6.

As shown in FIG. 7, a third mask 30 is formed to cover an entirety of the peripheral circuit region R2 and expose the core circuit region R1. More specifically speaking, the first STI 16a within the core circuit region R1, the second STI 16b within the core circuit region R1, the third STI 16c within the core circuit region R1 and the first silicon oxide layer 28 within the core circuit region R1 are exposed through the third mask 30. After that, the exposed first silicon oxide layer 28 is entirely removed while removing part of the first STI 16a within the core circuit region R1, part of the second STI 16b within the core circuit region R1, and part of the third STI 16c within the core circuit region R1 so as to make the first STI 16a within the core circuit region R1 protrude a third distance from the top surface of the substrate 10, the second STI 16b within the core circuit region R1 protrude a fourth distance from the top surface of the substrate 10 and the third STI 16c within the core circuit region R1 protrude a fifth distance from the top surface of the substrate 10. The third distance, the fourth distance and the fifth distance are all smaller than the height H shown in FIG. 2. According to a preferred embodiment of the present invention, after the removing steps in FIG. 7, the third distance which is between the top surface of the first STI 16a within the core circuit region R1 and the top surface of the substrate 10 is between 0 and 50 angstroms. The fourth distance which is between the top surface of the second STI 16b and the top surface of the substrate 10 is between 0 and 50 angstroms. The fifth distance between the top surface of the third STI 16c within the core circuit region R1 and the top surface of the substrate 10 is between 0 and 50 angstroms.

Figure 8:
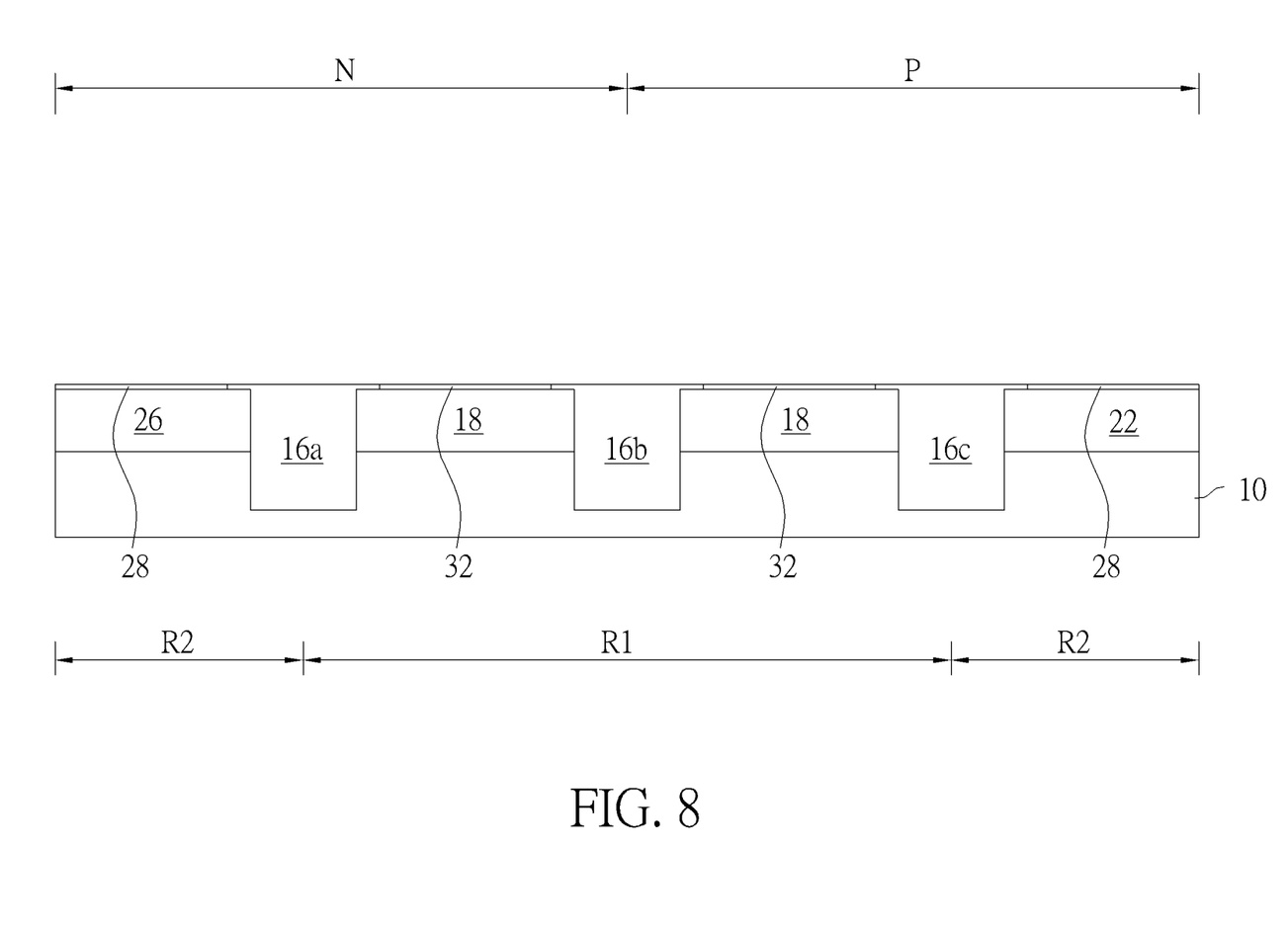
FIG. 8 is a fabricating stage following FIG. 7.

As shown in FIG. 8, after removing the third mask 30, a second silicon oxide layer 32 is formed within the core circuit region R1 to replace the first silicon oxide layer 28. The thickness of the second silicon oxide layer 32 is between 5 and 100 angstroms. According to a preferred embodiment of the present invention, the top surface of first STI 16a, the top surface of the second STI 16b, the top surface of the third STI 16c, the top surface of the second silicon oxide layer 32 and the top surface of the first silicon oxide layer 28 are aligned.

Figure 9:
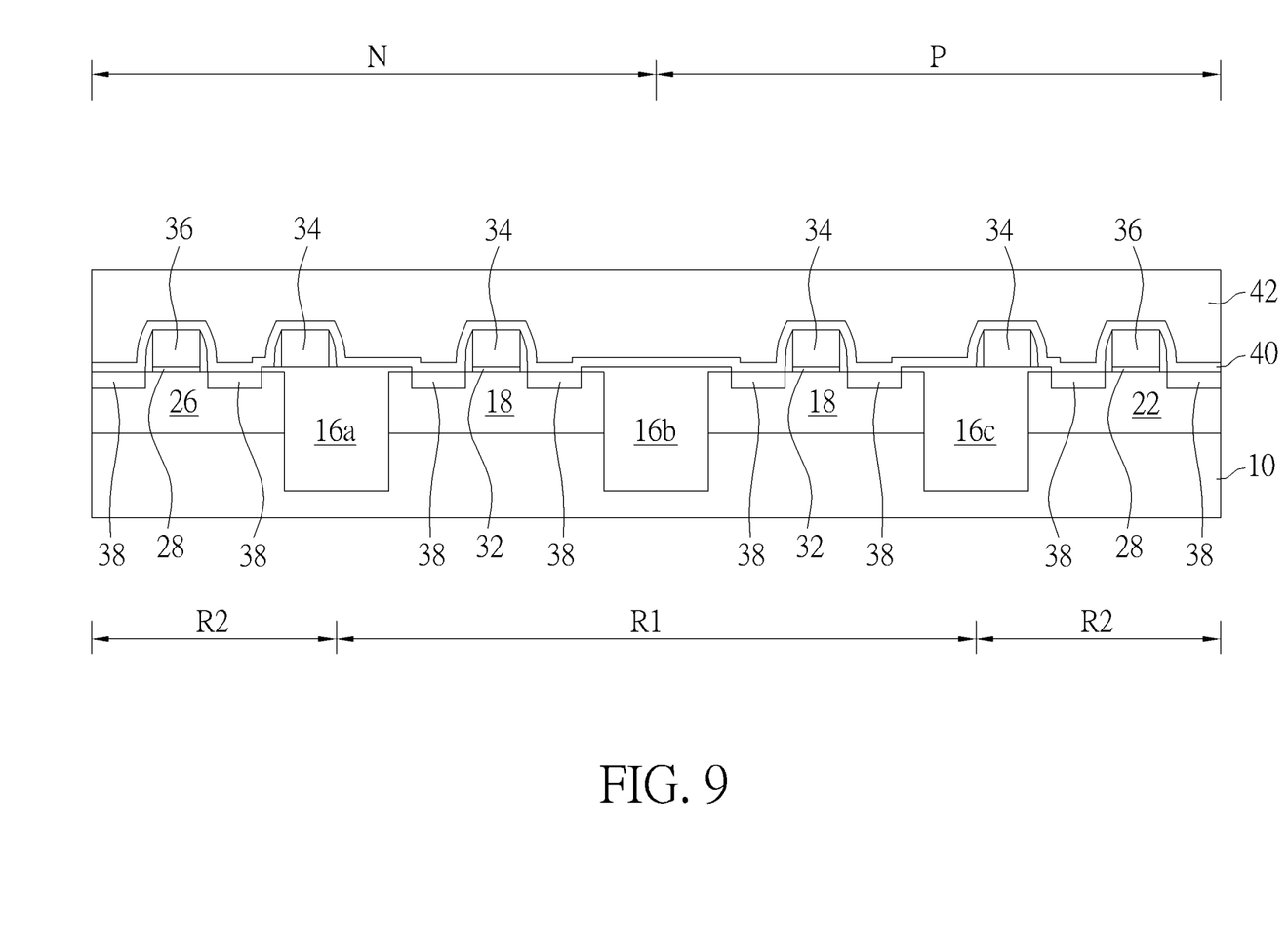
FIG. 9 is a fabricating stage following FIG. 8.

As shown in FIG. 9, numerous first gates 34 are formed respectively on the first STI 16a, the third STI 16c and the core circuit region R1 of the substrate R1. Numerous second gates 36 are respectively disposed on the P-type well 26 and the N-type well 22. The steps of forming the first gates 34 and the second gates 36 includes forming a polysilicon layer entirely cover the substrate 10. Later, the polysilicon is patterned to form the first gates 34 and the second gates 36.

Next, numerous source/drain doped regions 38 are respectively formed in the substrate 10 at two sides of each of the first gates 34 and at each of the second gates 36. The source/drain doped regions 38 within the P-type transistor region P are of P-type conductivity. The source/drain doped regions 38 within the N-type transistor region N are of N-type conductivity. Later, an etching stop layer 40 and a dielectric layer 42 are formed to cover the substrate 10, the first gates 34 and the second gates 36.

Figure 10:
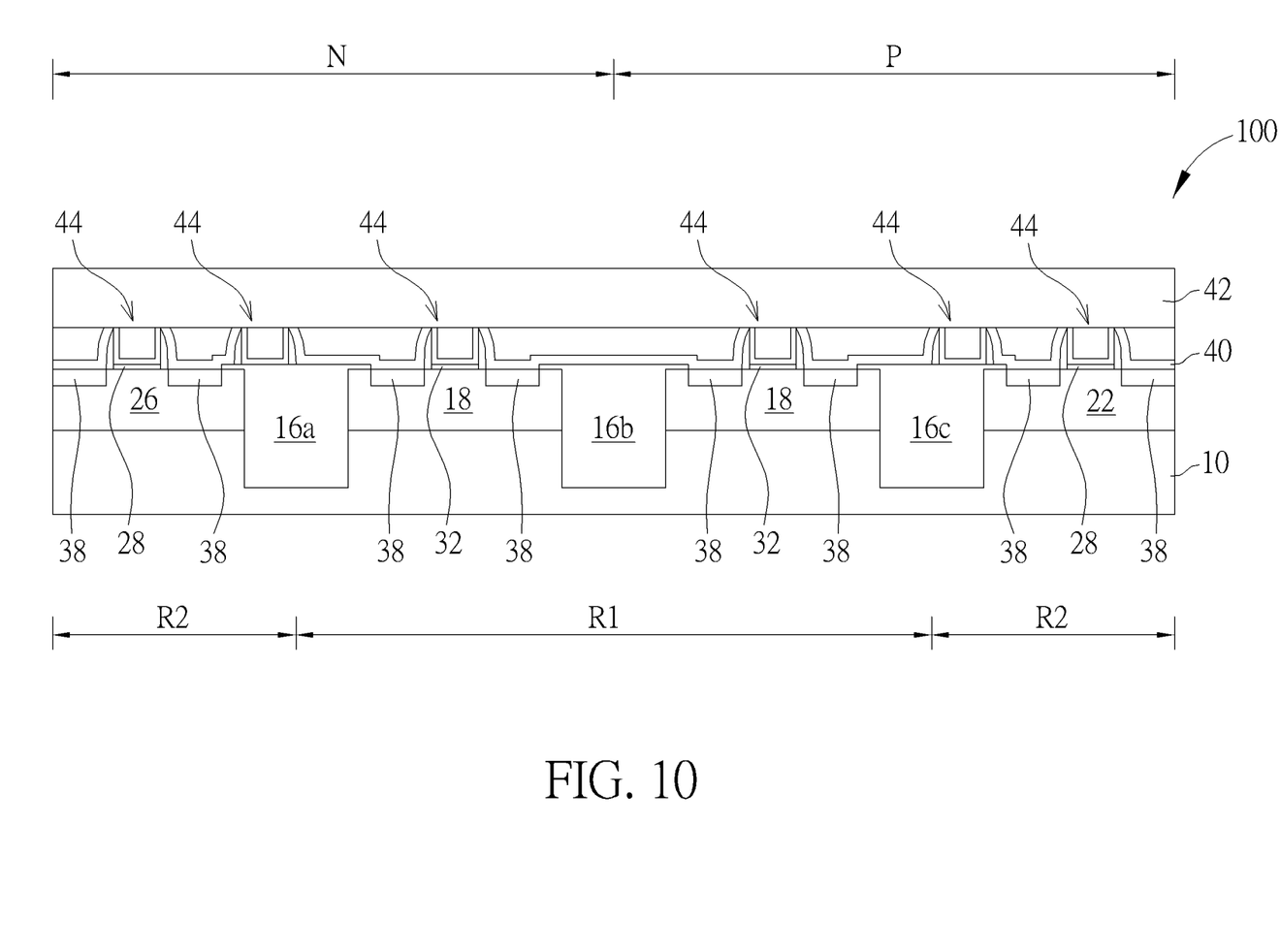
FIG. 10 is a fabricating stage following FIG. 9.

As shown in FIG. 10, the etching stop layer 40 and the dielectric layer 42 covering the first gates 34 and the second gates 36 are removed to expose the first gates 34 and the second gates 36. Subsequently, numerous metal gates 44 are formed to replace the first gates 34 and the second gates 36. Each of the metal gates 44 preferably includes a metal layer and a barrier. The metal gates 44 on the first STI 16a and the third STI 16c serve as dummy gates. At this point, a semiconductor structure 100 is completed.

It is noteworthy that the top surface of the first STI 16a, the top surface of the third STI 16c, the top surface of the first silicon oxide layer 28 and the top surface of the second silicon oxide layer 32 are aligned or slightly misaligned within an small range after the steps in FIG. 8 is completed; therefore, the top surfaces of the first gates 34 and the top surfaces of the second gates 36 are approximately aligned with one another. In this way, all the first gates 34 and the second gates 36 can be removed at the same step.

Figure 11:
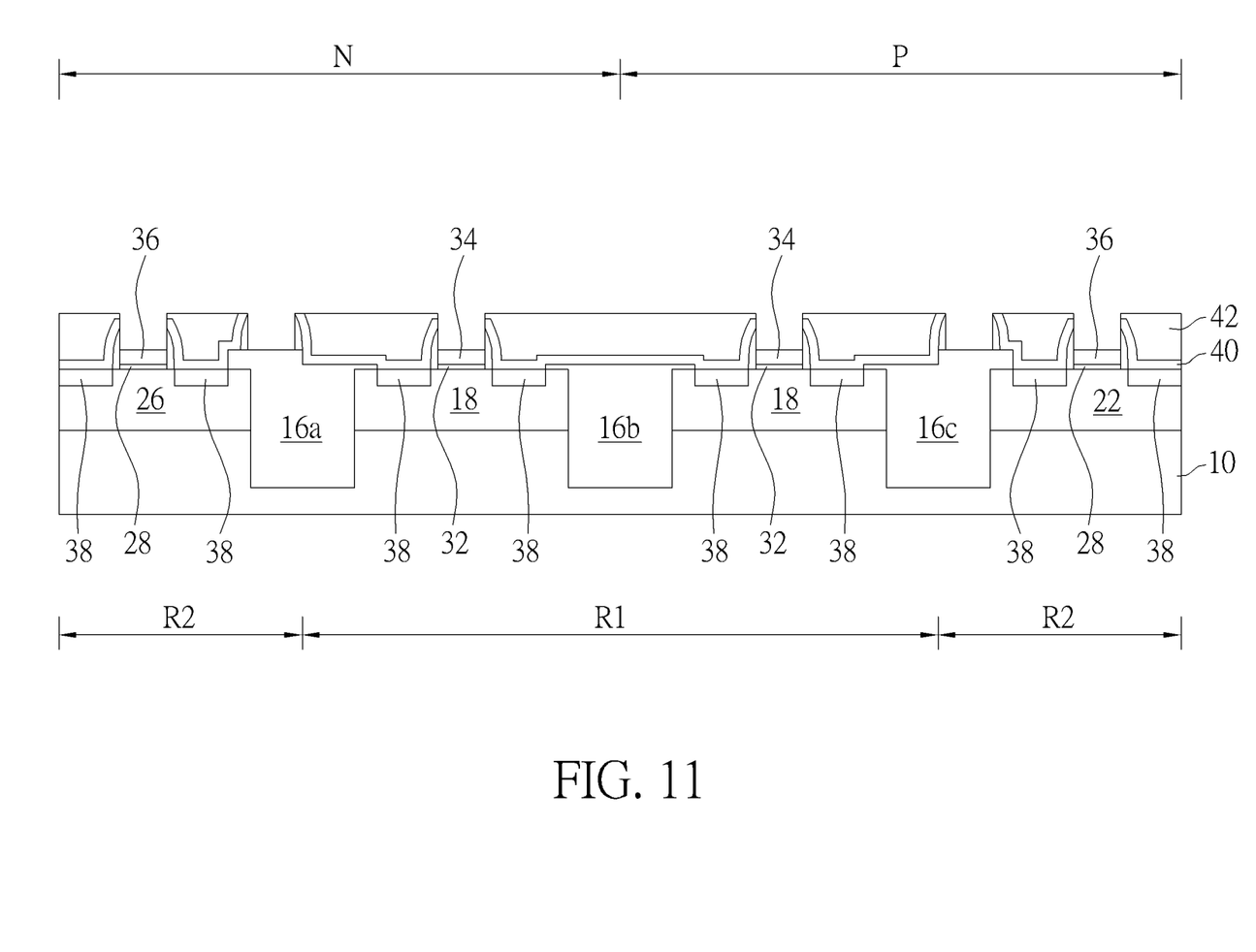
FIG. 11 depicts a fabricating method of a semiconductor structure according to an example of the present invention.

FIG. 11 depicts a fabricating method of a semiconductor structure according to an example of the present invention, wherein elements which are substantially the same as those in the embodiment of FIG. 10 are denoted by the same reference numerals; an accompanying explanation is therefore omitted. As shown in FIG. 11, if the removing steps including removing the first STI 16a and the third STI 16c in FIG. 3 and FIG. 4 are omitted, the top surfaces of the first gates 34 on the first STI 16a and the third STI 16c within the peripheral circuit region R2 become higher than the top surfaces of the first gates 34 within the core circuit region R1 and also higher than the top surfaces of the second gates 36 within the peripheral circuit region R2. Therefore, when removing the first gates 34 and the second gates 36, the top surfaces of the first gates 34 and the second gates 36 which are at a lower plane can only be removed partly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of decreasing height differences of shallow trench isolations (STIs), comprising:
providing a substrate comprising a core circuit region and a peripheral circuit region, wherein the peripheral circuit region comprises a P-type transistor region and an N-type transistor region, and wherein a pad oxide covers the substrate;
forming a first STI, a second STI and a third STI respectively disposed within the N-type transistor region of the peripheral circuit region, the core circuit region and the P-type transistor region of the peripheral circuit region, wherein the first STI, the second STI and the third STI are embedded within the pad oxide and the substrate, a top surface of the first STI protrudes a height from a top surface of the substrate, a top surface of the second STI protrudes the height from the top surface of the substrate, a top surface of the third STI protrudes the height from the top surface of the substrate;
forming a first mask to cover the core circuit region and the N-type transistor region and to expose the third STI and the P-type transistor region of the peripheral circuit region;
forming an N-type well by doping N-type dopants into the P-type transistor region which is exposed through the first mask and removing part of the third STI which is exposed through the first mask to make the top surface of the third STI protrude a first distance from the top surface of the substrate, and the first distance is smaller than the height;
removing the first mask;
forming a second mask to cover the core circuit region and the P-type transistor region and to expose the first STI and the N-type transistor region of the peripheral circuit region;
forming a P-type well by doping P-type dopants into the N-type transistor region which is exposed through the second mask and removing part of the first STI which is exposed through the second mask to make the top surface of the first STI protrude a second distance from the top surface of the substrate, and the second distance is smaller than the height;

removing the second mask;

after forming the P-type well and the N-type well, forming a first silicon oxide layer to replace the pad oxide;

after forming the first silicon oxide layer, forming a third mask to cover the peripheral circuit region and to expose the second STI and the first silicon oxide layer within the core circuit region;

removing part of the second STI and an entirety of the first silicon oxide layer within the core circuit region by taking the third mask as a mask so as to make the top surface of the second STI protrude a third distance from the top surface of the substrate, wherein the third distance is smaller than the height; and removing the third mask.

2. The method of decreasing height differences of STIs of claim 1, further comprising:

forming a second silicon oxide layer in the core circuit region.

3. The method of decreasing height differences of STIs of claim 2, wherein after forming the second silicon oxide layer, the top surface of the first STI, the top surface of the second STI, the top surface of the third STI, a top surface of the second silicon oxide layer and a top surface of the first silicon oxide layer are aligned.

4. The method of decreasing height differences of STIs of claim 2, further comprising:

forming a plurality of first gates and a plurality of second gates, wherein the plurality of first gates are respectively disposed on the first STI, the third STI and the core circuit region, and the plurality of second gates are respectively disposed on the P-type well and the N-type well;

forming a plurality of source/drain doped regions respectively in the substrate at two sides of each of the plurality of first gates and in the substrate at each of the plurality of second gates; and forming a plurality of metal gates replacing each of the plurality of first gates.

5. The method of decreasing height differences of STIs of claim 1, wherein the N-type well is formed before removing part of the third STI by taking the first mask as a mask.

6. The method of decreasing height differences of STIs of claim 1, wherein the P-type well is formed before removing part of the first STI by taking the second mask as a mask.

7. The method of decreasing height differences of STIs of claim 1, wherein after forming the first silicon oxide layer, part of the top surface of the third STI is aligned with a top surface of the first silicon oxide layer, part of the top surface of the first STI is aligned with the top surface of the first silicon oxide layer.

8. The method of decreasing height differences of STIs of claim 1, further comprising:

before forming the first STI, the second STI and the third STI, forming a pad nitride to cover the pad oxide;

forming the first STI, the second STI and the third STI to embed into the pad nitride, the pad oxide and the substrate;

performing an etching process to remove part of the first STI, part of the second STI and part of the third STI; and after the etching process, removing the pad nitride.

* * * * *